US005534741A

United States Patent [19]

Smith

[11] Patent Number: 5,534,741

[45] Date of Patent: Jul. 9, 1996

[54] ULTRASONIC PULSE CLEANER

[75] Inventor: Blaine M. Smith, Lincoln City, Oreg.

[73] Assignee: Sharper Image Corporation, San Francisco, Calif.

[21] Appl. No.: 311,874

[22] Filed: Sep. 26, 1994

[51] Int. Cl.[6] .......... H01L 41/08

[52] U.S. Cl. .......... 310/317

[58] Field of Search .......... 310/316, 317; 318/116; 73/647; 134/1, 68, 74, 111, 184

[56] References Cited

U.S. PATENT DOCUMENTS

| | | | |
|---|---|---|---|
| 2,985,003 | 5/1961 | Gelfand et al. | 310/317 X |
| 3,371,233 | 2/1968 | Cook | 310/317 |
| 3,638,087 | 1/1972 | Ratcliff | 318/118 |
| 3,980,906 | 9/1976 | Kuris et al. | 310/316 X |
| 4,319,155 | 3/1982 | Nakai et al. | 310/316 |
| 4,376,255 | 3/1983 | Kleinschmidt | 310/317 |
| 4,641,053 | 2/1987 | Takeda | 310/317 |
| 4,736,130 | 4/1988 | Puskas | 310/316 |
| 4,864,547 | 9/1989 | Krsna | 310/317 X |
| 5,109,174 | 4/1992 | Shewell | 310/317 |
| 5,218,980 | 6/1993 | Evans | 134/68 |

OTHER PUBLICATIONS

Brookstone Hard-To-Find Tools Catalog, "Ultrasonic cleaner", p. 54, (1993).

*Primary Examiner*—Mark O. Budd
*Attorney, Agent, or Firm*—Flehr, Hohbach, Test, Albritton & Herbert

[57] ABSTRACT

An ultrasonic pulse cleaner has a driving circuit which receives current from a source and drives an ultrasonic energy generating element. A timer connected to the driving circuit permits operation in a first mode in which the ultrasonic energy generating element generates ultrasonic energy at a substantially continuous rate, and in a second mode in which the ultrasonic energy generating element generates ultrasonic energy as a plurality of discrete pulses.

9 Claims, 6 Drawing Sheets

ULTRASONIC PULSE CLEANER

BACKGROUND OF THE INVENTION

1. Field of the Invention

The present invention relates generally to ultrasonic cleaners and, more particularly, to an ultrasonic cleaner employing pulsing of the ultrasonic cleaning element.

2. Description of the Background

Ultrasonic cleaners are known which employ ultrasonic energy generating elements for producing ultrasonic energy that cleans a workpiece. The known ultrasonic cleaners have the disadvantage of having a high duty cycle. That is, the ultrasonic energy generating element, generally a Piezo device, is energized for a large percentage of the time that the cleaner is in operation. This high duty cycle results in the production of a great amount of heat, wasting energy and forcing the use of thicker and more expensive materials to dissipate this heat. In addition, the constant bombardment of the workpiece with ultrasonic energy does not provide optimum cleaning of the workpiece.

One conventional ultrasonic cleaner with such a high duty cycle has been sold by the assignee of the instant application as model number SI410. FIGS. 6(A) and 6(B) are circuit diagrams of that conventional cleaner.

SUMMARY OF THE INVENTION

It is an object of the present invention to overcome the deficiencies of the known ultrasonic cleaners by providing an ultrasonic pulse cleaner in which the ultrasonic energy generating element is pulsed.

It is another object of the present invention to provide an ultrasonic pulse cleaner in which the ultrasonic energy generating element is pulsed, causing large transient motion in the ultrasonic energy generating element that, when translated to a cleaning agent, causes disturbances that force foreign matter out of a workpiece.

It is another object of the present invention to provide an ultrasonic pulse cleaner in which the ultrasonic energy generating element exhibits a reduced duty cycle as compared to conventional ultrasonic cleaners.

It is a further object of the present invention to provide an ultrasonic pulse cleaner in which the ultrasonic energy generating element produces less heat.

The above and other objects, features, and advantages of the present invention are achieved, as will become apparent from the following detailed description of the preferred embodiment when read in conjunction with the accompanying drawings.

DETAILED DESCRIPTION OF THE PREFERRED EMBODIMENT

Figure 1:
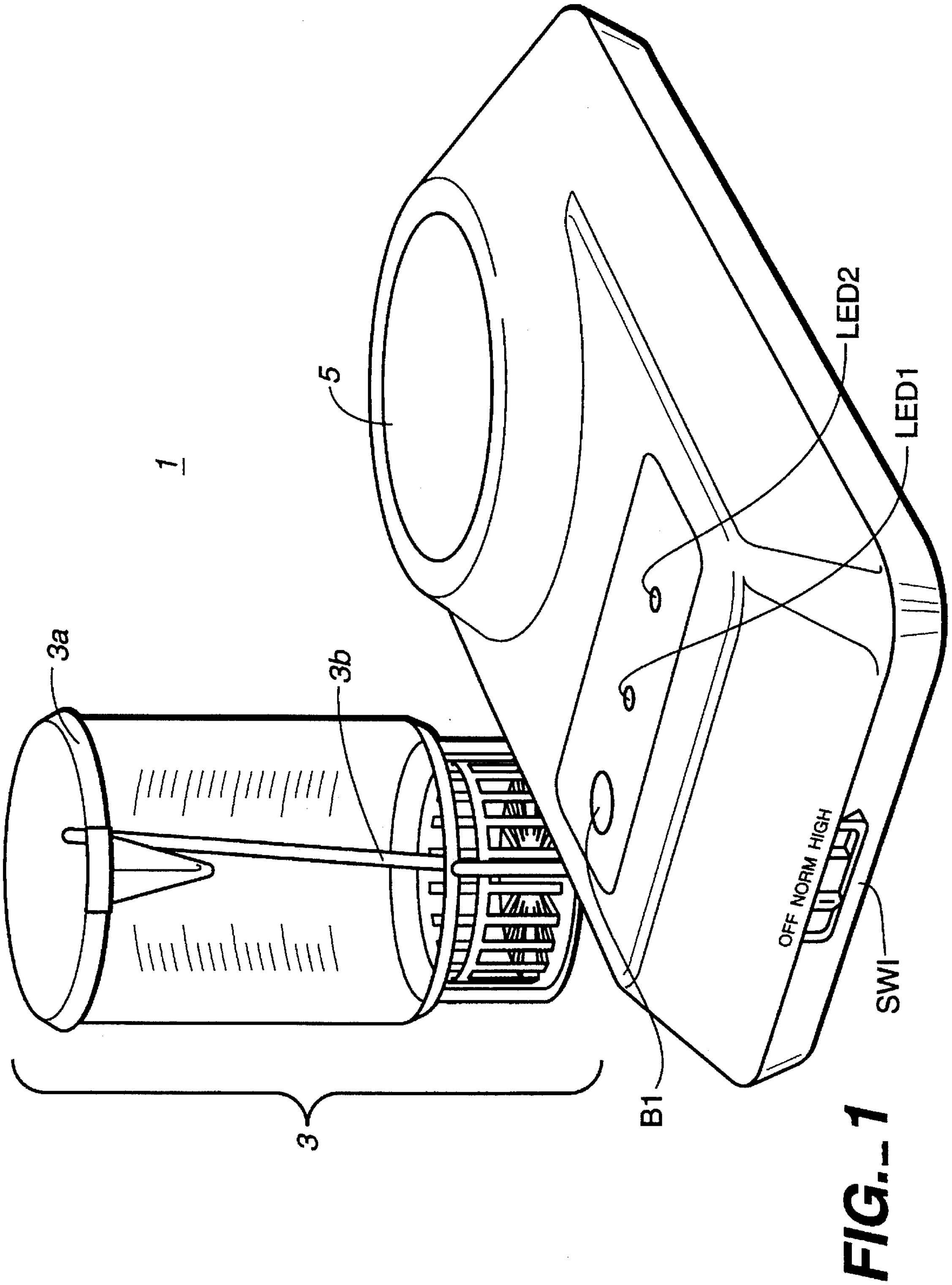
FIG. 1 is a perspective view of an ultrasonic pulse cleaner according to the present invention.

With reference to the drawings, and particularly FIG. 1, an ultrasonic pulse cleaner 1 according to the present invention is shown. The ultrasonic pulse cleaner 1 has three position switch SW1, LED1, LED2, and reset button B1. The graduated storage cup 3, which includes lid 3*a* and jewelry basket 3*b* is sized to fit within well 5. The ultrasonic pulse cleaner 1 is used by placing a liquid cleaning solution and the workpiece (not shown) in the storage cup 3, placing the storage cup 3 within the well 5 and setting the switch SW1 to either the NORMAL or HIGH position. In the alternative, the cleaning solution and the workpiece may be placed directly into well 5.

Figure 2:
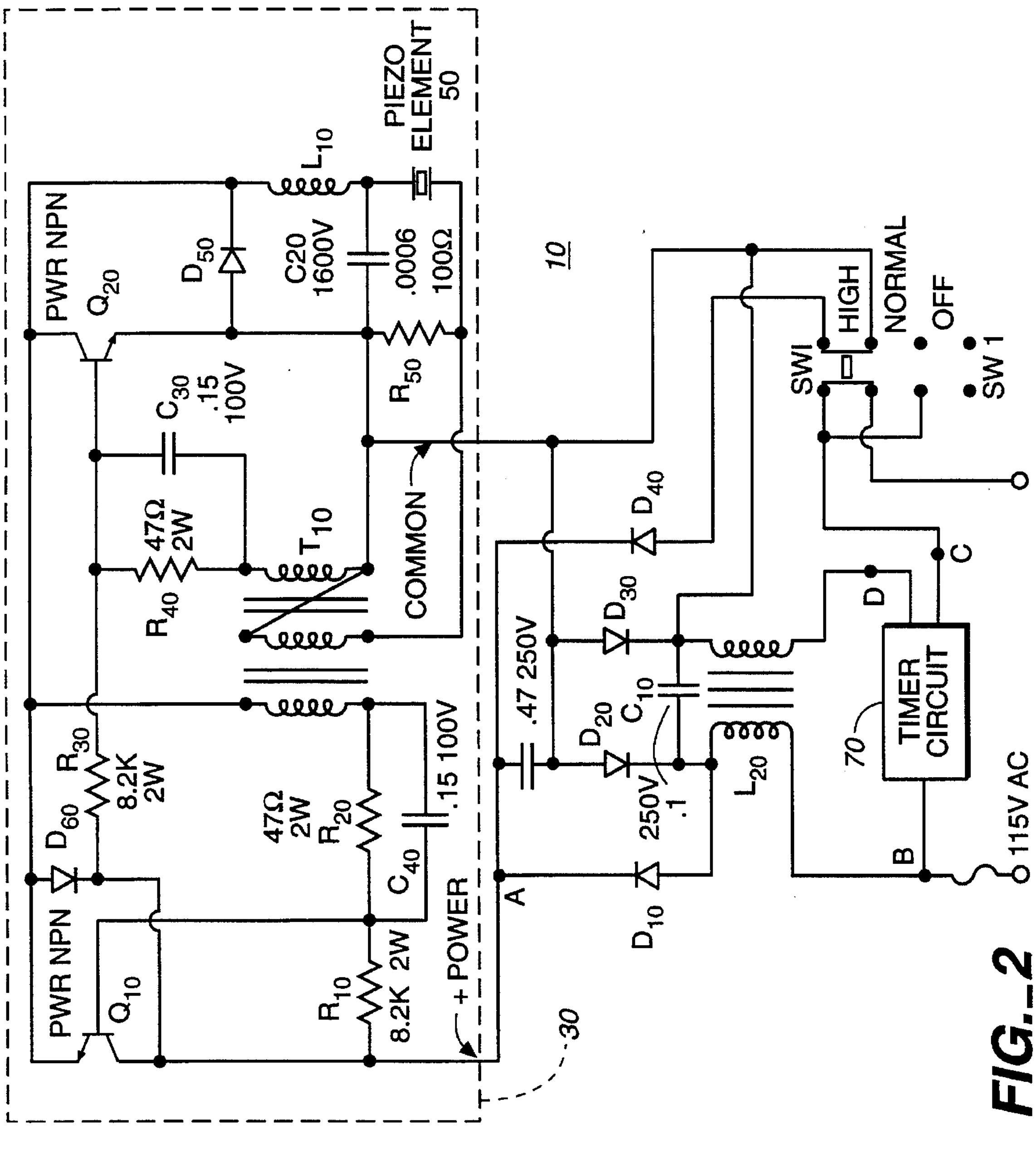
FIG. 2 is a circuit diagram of an ultrasonic pulse cleaner according to the present invention.

Now, with reference to FIG. 2, a circuit 10 for an ultrasonic pulse cleaner according to the present invention is shown.

Power switch SW1 provides power to only diode D30 in the NORMAL position so that the +power coming from diode D10 at node A is ½ wave rectified, 60 Hz, pulsating DC. When switch SW1 is switched to the HIGH position, diode D40 is also connected and the + power coming from diode D10 at node A is full wave rectified to 120 Hz, pulsating DC.

The Piezo drive circuit 30 self oscillates, pulling inductor L10 up to + power and down to common at or about the resonating frequency of the Piezo element 50 (40 KHz). This oscillation causes the Piezo element end of inductor L10 to reach, about 1000 V to drive the Piezo element 50 in its Axial mode which, when connected to a metal well (shown in FIG. 1 as element 5), vibrates the well and its contents. As stated above, the contents preferably includes a liquid cleaning solution for facilitating the cleansing of the workpiece.

The self oscillation of Piezo drive circuit 30 is as follows. When transistor Q10 is turned on, inductor L10 charges positively, and transistor Q20 is turned off. When inductor L10's inductive charge begins to collapse, it feeds back through transformer T10 to switch transistor Q10 off and transistor Q20 on, pulling down on inductor L10. The oscillation frequency is dependent mainly upon the characteristics of the Piezo element 50.

Since the + power is not filtered DC, the 40 KHz oscillation is modulated on and off by either the 60 Hz ½ sine wave in the NORMAL mode or by the 120 Hz ½ sine wave in the HIGH mode.

Inductor L20 and capacitor C10 form a line filter to keep the 40 KHz from radiating into the power line. R10 and R30 set the bias and R20, R40, C30, and C40 set the drive current of Q10 and Q20. D50 and D60 protect Q10 and Q20 from reverse transients.

Figure 3:
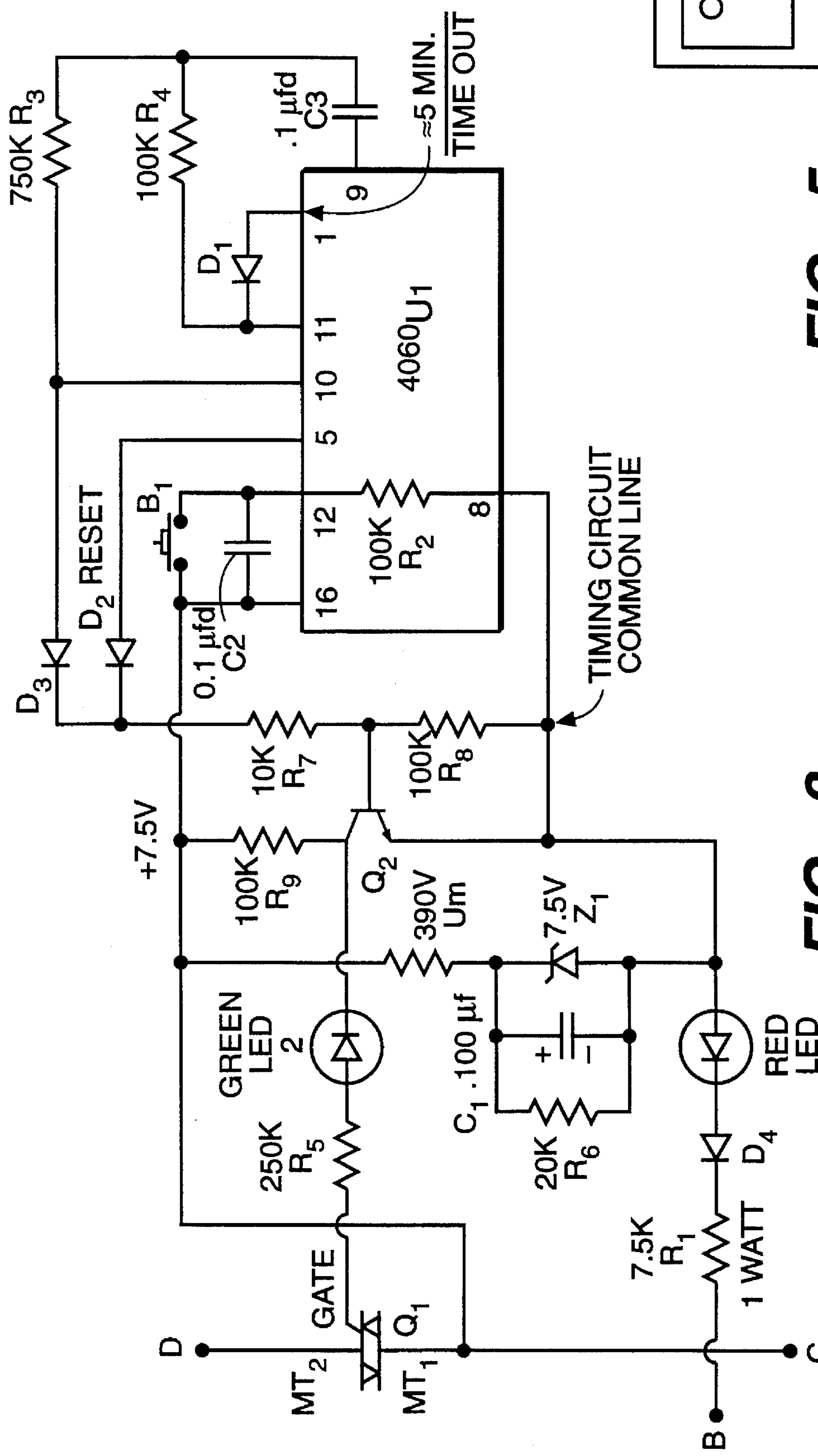
FIG. 3 is a detailed circuit diagram of the timer circuit of FIG. 2.

The timer circuit 70, which is connected at nodes B, C, and D, is shown in detail in FIG. 3. As seen in FIG. 3, nodes B, C, and D correspond to nodes B, C, and D of FIG. 2.

Resistor R1 is connected to one side of the line-in at node B. Resistor R1 supplies timer current through diode D4 and the LED1 into the 7.5 V Zenner diode Z1 to create a low voltage DC supply. Capacitor C1 is the DC power supply filter capacitor.

Capacitor C2 resets pin 12 of U1, a 4060 timer, during initial power on. Resistor R2 charges C2, pulling pin 12 to ground and permitting the timer to run. C3, R3, and R4 make up the oscillator that drives the counter side of U1. D1 is pulled on and shuts off the oscillator at the end of approximately 5 minutes of running, leaving all other outputs of the 4060 timer down.

Diode D3 connects the pulsing output of pin 10 of the 4060 timer to the base of transistor Q2, while diode D2, which is connected to pin 5 of the 4060 timer, gates the pulsing on and off about every 2.5 seconds At the end of 5 minutes of running, pins 5 and 10 of the 4060 timer go low, disconnecting both D2 and D3.

Figure 5:
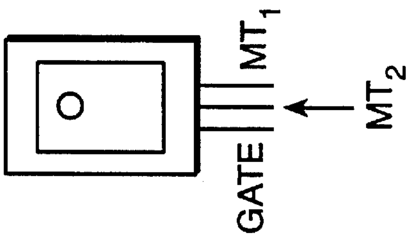
FIG. 5 shows Q1, a 2N6071A triac.

As shown in FIG. 5, triac Q1 is a sensitive gate triac that requires 5 ma or more gate current in quadrant 2 and 3 (negative gate current in relation to MT1). When the unit is running, that is, in the NORMAL or HIGH mode, the gate of the triac Q1 is driven with about 5 ma, which leaves almost no current for the Zenner diode Z1 and the + supply ranges from 7.5 V when the timer is off to about 6 V with the timer running.

The signals from D2 and D3 turn transistor Q2 on and off. When Q2 is turned on, its collector comes down, pulling the cathode of LED2 down below triac Q1's MT1 terminal, causing about 5 ma of gate current to flow into triac Q1, turning it and the Piezo element 50 on.

Figure 4A:
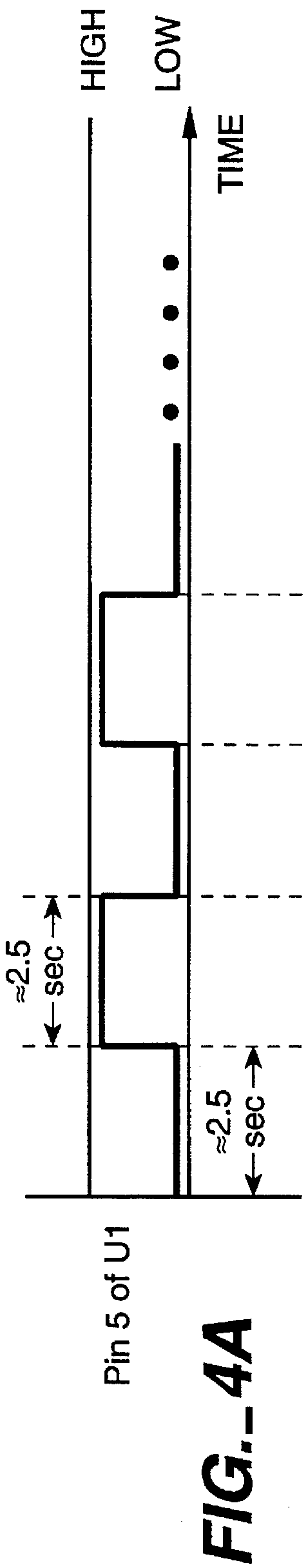
FIG. 4(A) is a graph showing a waveform present at pin 5 of U1 of FIG. 3.
Figure 4B:
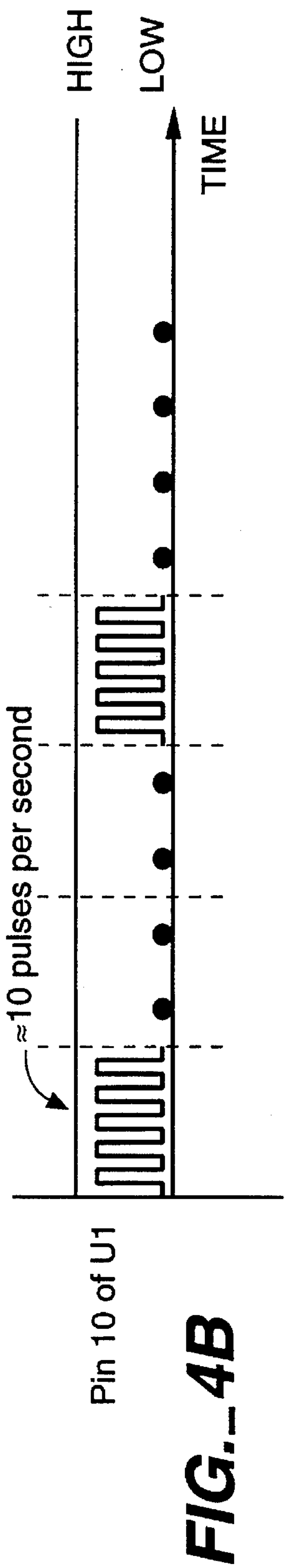
FIG. 4(B) is a graph showing a waveform present at pin 10 of U1 of FIG. 3.
Figure 4C:
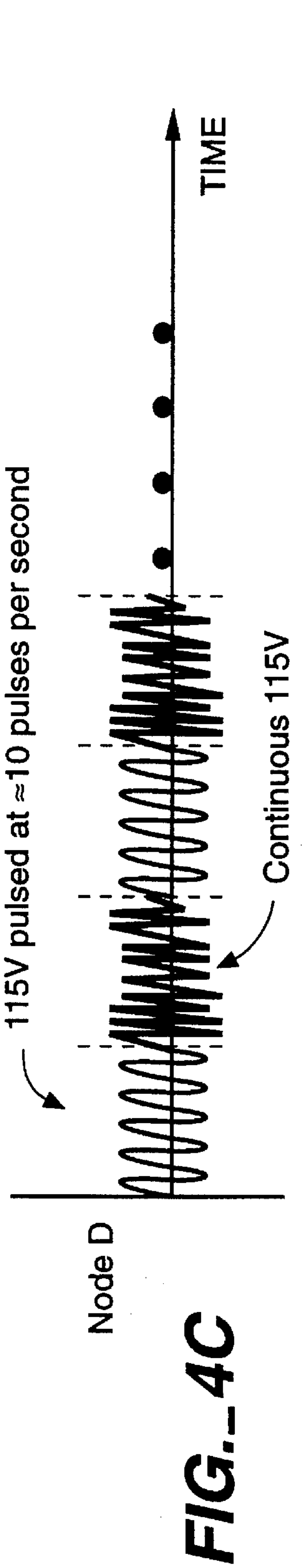
FIG. 4(C) is a graph showing a waveform present at node D of the timer shown in FIG. 3.
Figures 6, 6A:
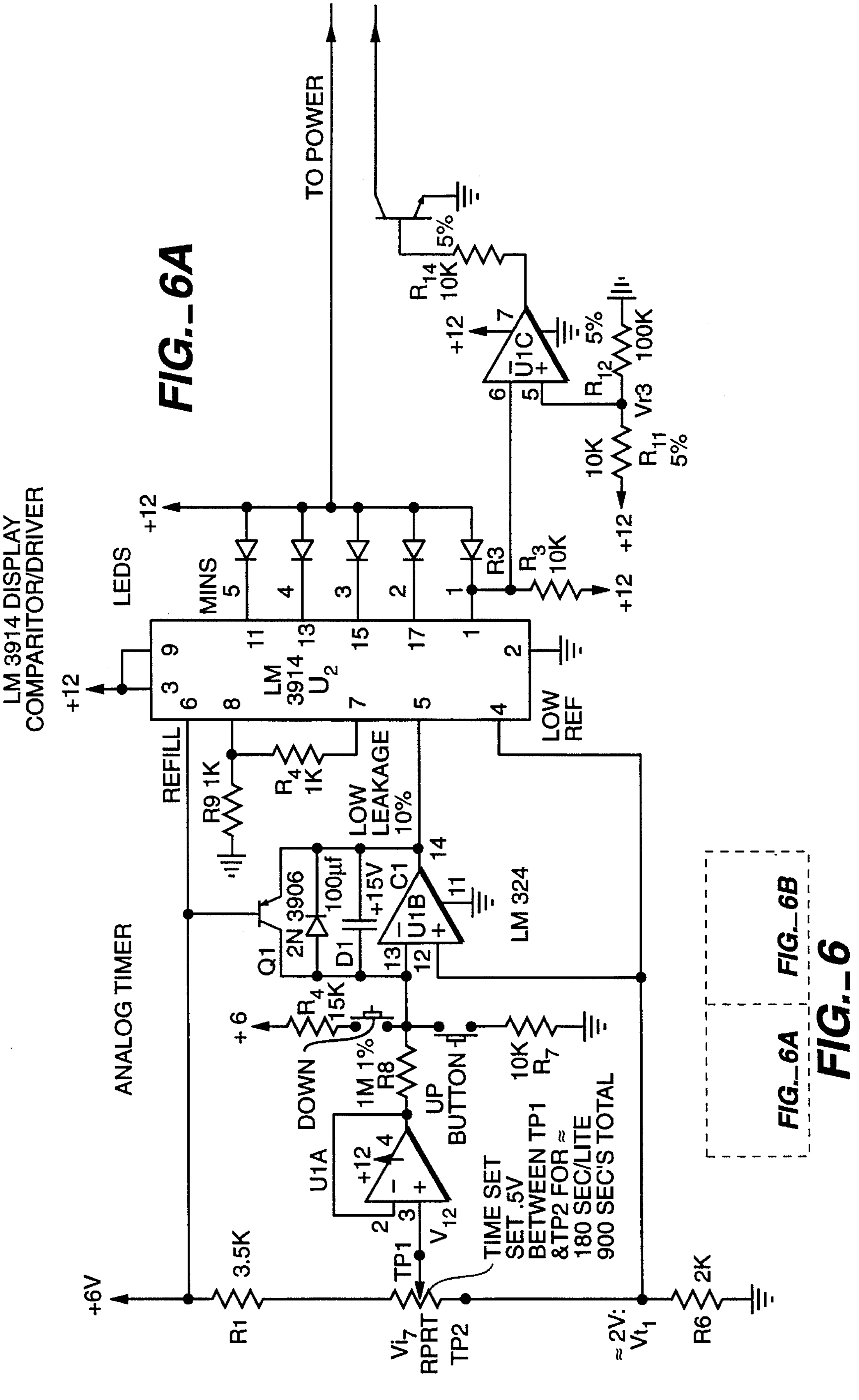
FIG. 6(A) is detailed circuit diagram of a timer section of a conventional ultrasonic cleaner.
Figure 6B:
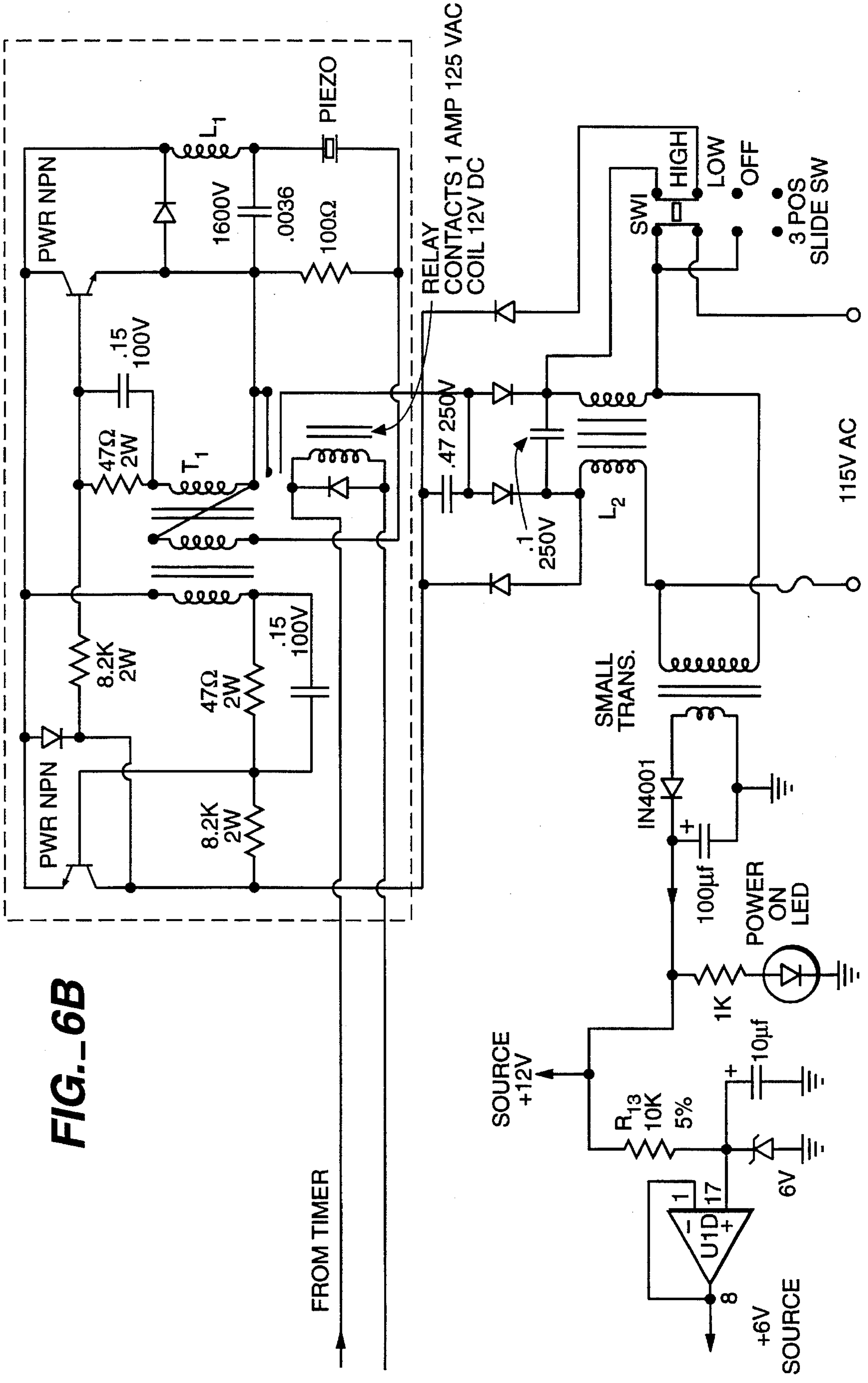
FIG. 6(B) is detailed circuit diagram of a power section of a conventional ultrasonic cleaner.

As can be seen from the timing charts in FIGS. 4(A)–4(C), pin 5 of U1 controls the 2.5 second gating of the triac Q1 between the pulsed and non-pulsed modes through D2 and pin 10 provides the pulsing of the triac through D3. That is, when pin 5 of U1 goes high, nodes B and D receive continuous 115 V input power regardless of the state of pin 10 of U1. However, when pin 5 of U1 goes low, nodes B and D receive 115 V input power only when pin 10 of U1 goes high, that is, about 10 times every second. Thus, the 10 Hz pulsing provided through D3 by pin 10 of U1 is gated by pin 5 of U1 through D2 to provide pulsing every other 2.5 seconds, with continuous operation (pin 5 of U1 being high) occurring between the pulsing mode (pin 5 of U1 being low).

When the unit is turned off, capacitor C1 discharges through resistor R6. This takes about 10 seconds before power on will restart the counter. In the alternative, pushing the reset button B1 restarts the counter.

Component values for the preferred embodiment are as indicated in Table 1 below.

TABLE 1

| | | | |
|---|---|---|---|
| R1 | 7.5K | 1 W | 5% |
| R2, 4 | 100K | 1/4 W | 5% |
| R3 | 750K | 1/4 W | 5% |
| R5 | 750 ohm | 1/4 W | 5% |
| R6 | 20K | 1/4 W | 5% |
| R7 | 10K | 1/4 W | 5% |
| R8, 9 | 100K | 1/4 W | 5% |
| Z1 | 7.5 V Zenner | 1/4 W | |
| LED1 | Red | super bright (runs on less than 10 ma) | |
| LED2 | Green | super bright (runs on 5 ma) | |
| C1 | 100 Ufd | 10 V Electrolytic | |
| C2 | 1 Ufd | 10 V Electrolytic | |
| C3 | .1 Ufd | Mylar | |
| D1, 2, 3 | diodes | 1N4148 (or any small signal diode) | |
| U1 | 4060 | Oscillator/Timer | |
| Q1 | 2N6071A | Triac, 200 V, 5 ma gate (II & III) | |
| Q2 | 2N3904 | NPN transistor | |

In operation, when the switch SW1 is moved to either the NORMAL or HIGH position the red LED1 comes on. The oscillation of the Piezo element 50 is then modulated on and off by timer circuit 70 at a frequency of about 10 Hz for about 2.5 seconds Following that interval the Piezo element 50 oscillates without the additional modulation for about 2.5more seconds and then the cycle repeats, that is, 2.5 seconds of modulated oscillation and 2.5 seconds of oscillation without the 10 Hz modulation. After running for approximately 5 minutes, the cleaner shuts off.

The green LED2 tracks the pulsing on and off, that is, the 10 Hz modulation. This LED2 goes off at the end of the 5 minute run time of the cleaner while the red LED1 remains illuminated until the switch SW1 is turned OFF.

It should be noted that the ultrasonic oscillation of the piezo element 50 at approximately 40 KHz is at a frequency too high to produce visible waves in the cleaning solution. In contrast, the 60 Hz and 120 Hz modulation of the piezo element 50 in the NORMAL and HIGH modes, respectively, produces small visible waves in the cleaning solution. In addition, the 10 Hz modulation of the piezo element 50 produces even larger visible waves in the cleaning solution, which aid in cleaning the workpiece.

The power to the cleaner must be shut off for about 10 seconds before it can be turned back on in order to allow the timer to reset. In the alternative, the user can restart the timer by depressing the reset button B1.

Any variations or modifications of the present invention envisioned by one of ordinary skill in the art are contemplated to be within the scope of this invention.

I claim:

1. An ultrasonic pulse cleaner powered by an alternating source of electric current, comprising:

an ultrasonic energy generating element;

driving means, receiving said current, for driving said ultrasonic energy generating element, wherein said ultrasonic energy generating element generates ultrasonic energy at a self-oscillating frequency when driven by said driving means; and a timer, connected to said driving means, controlling said driving means to permit operation in a first mode in which said ultrasonic energy generating element generates ultrasonic energy at a substantially continuous non-zero rate, and in a second mode in which said ultrasonic energy generating element generates ultrasonic energy as a plurality of discrete pulses;

wherein said ultrasonic energy generating element generates ultrasonic energy at all times when said ultrasonic pulse cleaner is powered by said source of electric current.

2. An ultrasonic pulse cleaner according to claim 1 wherein said plurality of discrete pulses generated by said ultrasonic energy generating element when said driving means is in said second mode are generated at a rate of about ten pulses per second.

3. An ultrasonic pulse cleaner according to claim 2 wherein said timer controls said driving means to operate in said first and second modes in a cyclical fashion.

4. An ultrasonic pulse cleaner according to claim 3 wherein said timer controls said driving means to operate in said first mode for about 2.5 seconds and in said second mode for about 2.5 seconds.

5. An ultrasonic pulse cleaner according to claim 1 wherein said timer comprises a triac connected between said source of electric current and said driving means receiving said source of electric current.

6. An ultrasonic pulse cleaner according to claim 1 wherein said ultrasonic energy generating element comprises a Piezo element.

7. An ultrasonic pulse cleaner according to claim 1 further comprising rectifier means for receiving current from said source as an input for producing one of a half-wave rectified signal and a full-wave rectified signal as an output to be received by said driving means.

8. An ultrasonic pulse cleaner according to claim 7 further comprising switch means with a first state and a second state connected to said rectifier means, wherein said rectifier means produces said half-wave rectified signal when said switch means is in said first state and said full-wave rectified signal when said switch means is in said second state.

9. A method of driving an ultrasonic energy generating element used in an ultrasonic pulse cleaner in which said ultrasonic energy generating element generates ultrasonic energy at a self-oscillating frequency and is powered by an alternating source of electric current in a first mode in which said ultrasonic energy generating element generates ultrasonic energy at a substantially continuous non-zero rate, and is powered in a second mode in which said ultrasonic energy generating element generates ultrasonic energy as a plurality of discrete pulses, comprising:

supplying said current to said ultrasonic energy generating element in said first mode;

generating a plurality of timing signals; and interrupting said supply of current to said ultrasonic energy element in response to said plurality of timing signals in said second model;

wherein said ultrasonic energy generating element so driven generates ultrasonic energy at all times when said ultrasonic pulse cleaner is powered by said source of electric current.

* * * * *